United States Patent
Henry et al.

(10) Patent No.: US 9,203,134 B1
(45) Date of Patent: Dec. 1, 2015

(54) TUNING METHOD FOR MICRORESONATORS AND MICRORESONATORS MADE THEREBY

(71) Applicant: Sandia Corporation, Albuquerque, NM (US)

(72) Inventors: Michael David Henry, Albuquerque, NM (US); Roy H. Olsson, Albuquerque, NM (US); Karl Douglas Greth, Albuquerque, NM (US); Travis Ryan Young, Albuquerque, NM (US); Janet Nguyen, Albuquerque, NM (US); James E. Stevens, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 232 days.

(21) Appl. No.: 13/780,285

(22) Filed: Feb. 28, 2013

(51) Int. Cl.
| | |
|---|---|
| *H03H 9/00* | (2006.01) |
| *H01P 11/00* | (2006.01) |
| *H01P 1/201* | (2006.01) |
| *H03H 3/007* | (2006.01) |
| *H03H 9/46* | (2006.01) |

(52) U.S. Cl.
CPC .............. *H01P 11/007* (2013.01); *H01P 1/201* (2013.01); *H03H 3/0077* (2013.01); *H03H 9/462* (2013.01)

(58) Field of Classification Search
CPC .................................. H03H 3/02; H03H 9/173
USPC ........... 333/187–189, 197, 200; 310/324, 339
See application file for complete search history.

(56) References Cited

U.S. PATENT DOCUMENTS

| | | | |
|---|---|---|---|
| 3,921,093 A | 11/1975 | Lewis | |
| 4,890,370 A * | 1/1990 | Fukuda et al. | 216/2 |
| 5,874,866 A | 2/1999 | Satoh et al. | |
| 6,794,948 B2 | 9/2004 | Kobayashi et al. | |
| 7,385,334 B1 | 6/2008 | Olsson et al. | |
| 7,616,077 B1 | 11/2009 | Wittwer et al. | |
| 7,647,688 B1 * | 1/2010 | Chang et al. | 29/594 |
| 7,652,547 B1 | 1/2010 | Wittwer et al. | |
| 7,733,198 B1 | 6/2010 | Olsson et al. | |
| 7,836,566 B1 | 11/2010 | Olsson et al. | |
| 7,859,350 B1 | 12/2010 | Schwindt et al. | |
| 8,094,023 B1 | 1/2012 | El-Kady et al. | |
| 8,367,305 B1 | 2/2013 | Wojciechowski et al. | |
| 8,497,747 B1 | 7/2013 | Wojciechowski et al. | |
| 8,508,370 B1 | 8/2013 | El-Kady et al. | |
| 8,525,619 B1 | 9/2013 | Olsson et al. | |
| 8,597,985 B1 | 12/2013 | Chanchani et al. | |
| 8,600,200 B1 | 12/2013 | Rakich et al. | |
| 8,669,823 B1 | 3/2014 | Olsson et al. | |
| 8,872,246 B1 | 10/2014 | Stevens et al. | |
| 2010/0181868 A1 | 7/2010 | Gaidarzhy et al. | |
| 2010/0315170 A1 | 12/2010 | LoCascio et al. | |

(Continued)

OTHER PUBLICATIONS

U.S. Appl. No. 13/649,025, filed Oct. 10, 2012, Olsson, R. et al.

(Continued)

*Primary Examiner* — Dinh Le
(74) *Attorney, Agent, or Firm* — Helen S. Baca

(57) ABSTRACT

A micromechanical resonator is disclosed. The resonator includes a resonant micromechanical element. A film of annealable material can be deposited on a facial surface of the element. The resonance of the element can be tuned by annealing the deposited film. Also disclosed are methods of applying a film on a resonator and annealing the film, thereby tuning one or more resonant properties of the resonator.

37 Claims, 4 Drawing Sheets

(56) References Cited

U.S. PATENT DOCUMENTS

2012/0091862 A1* 4/2012 Link et al. .................. 310/365
2013/0093288 A1* 4/2013 Fox et al. .................... 310/348

OTHER PUBLICATIONS

Kim, B. et al., "Oven-Based Thermally Tunable Aluminum Nitride Microresonators", Article has been accepted for inclusion in a future issue of Journal of Microelectromechanical Systems; pp. 1-10.
Olsson, R., et al., "Microresonator Filters and Frequency References", Sandia National Laboratories R&D 100 2011; pp. 1-23.
U.S. Appl. No. 13/932,859, filed Jul. 1, 2013, Nordquist et al.
U.S. Appl. No. 13/959,136, filed Aug. 5, 2013, Wojciechowski et al.
U.S. Appl. No. 14/051,818, filed Oct. 11, 2013, Wojciechowski et al.
U.S. Appl. No. 14/288,236, filed May 27, 2014, Olsson et al.
Chanchani R et al., "A new wafer-level packaging technology for MEMS with hermetic micro-environment," *IEEE Electronic Components and Technology Conference (ECTC)*, held on May 31-Jun. 3, 2011 in Lake Buena Vista, FL, pp. 1604-1609.
Choi, SR et al., "Thermal Conductivity of AlN and SiC Thin Films," *Int'l J. Thermophys*. 2006;27(3):896-905.
Fedder GK et al., "Technologies for cofabricating MEMS and electronics," *Proc. IEEE* 2008; 96(2):306-22.
Henry MD et al., "Frequency trimming of aluminum nitride microresonators using rapid thermal annealing," *J. Microelectromech. Sys.* Jun. 2014;23(3):620-7.
Henry MD et al., "Hermetic wafer-level packaging for RF MEMs: effects on resonator performance," *IEEE Electronic Components and Technology Conference (ECTC)*, held on May 29-Jun. 1, 2012 in San Diego, CA, pp. 362-369.
Henry MD et al., "Platinum diffusion barrier breakdown in a-Si/Au eutectic wafer bonding," *IEEE Trans. Components Packaging Manufact. Technol.* Jun. 2013;3(6):899-903.
Hsu WT et al., "Frequency trimming for MEMS resonator oscillators," *IEEE Int'l Frequency Control Symposium Joint with the 21st European Frequency and Time Forum*, held on May 29-Jun. 1, 2007 in Geneva, Switzerland, pp. 1088-1091.
Huang WL et al., "Fully monolithic CMOS nickel micromechanical resonator oscillator," *IEEE Int'l Conference on Micro Electro Mechanical Systems*, held on Jan. 13-17, 2008 in Tucson, Arizona, pp. 10-13.
Jha CM et al., "Thermal isolation of encapsulated MEMS resonators," *J. Microelectromech. Sys.* Feb. 2008;17(1):175-84.
Jing E et al., "The bond strength of Au/Si eutectic bonding studied by IR microscope," *IEEE Trans. Electron. Packaging Manufact.* Jan. 2010;33(1):31-7.
Kato R et al., "Thermal conductivity measurement of submicron-thick films deposited on substrates by modified ac calorimetry (laser-heating angstrom method)," *Int'l J. Thermophys*. 2001;22(2):617-29.
Kim B et al., "AlN microresonator-based filters with multiple bandwidths at low intermediate frequencies," *J. Microelectromech. Sys.* Aug. 2013;22(4):949-61.
Kim B et al., "Capacitive frequency tuning of AlN micromechanical resonators," *Int'l Solid-State Sensors, Actuators and Microsystems Conference (Transducers)*, held on Jun. 5-9, 2011 in Beijing, China, pp. 502-505.
Kim B. et al., "Oven-based thermally tunable aluminum nitride microresonators," *J. Microelectromech. Sys.* Apr. 2013;22(2):265-75.
Kim B et al., "Ovenized and thermally tunable aluminum nitride microresonators," *IEEE Ultrasonics Symposium (IUS)*, held on Oct. 11-14, 2011 in San Diego, CA, pp. 974-978.
Lee KH et al., "Au metal-induced lateral crystallization (MILC) of hydrogenated amorphous silicon thin film with very low annealing temperature and fast MILC rate," *Electron. Lett.* Jun. 1999;35(13):1108-9.
Melamud R et al., "Effects of stress on the temperature coefficient of frequency in double clamped resonators," *Int'l Conference on Solid-State Sensors, Actuators and Microsystems (Transducers)*, held on Jun. 5-9, 2005 in Seoul, South Korea, pp. 392-395.
Mitchell JS "Low temperature wafer level vacuum packaging using Au—Si eutectic bonding and localized heating," *Ph.D. Dissertation for Mechanical Engineering at the University of Michigan*, 2008 (309 pp.).
Nordquist CD et al., "Radio frequency microelectromechanical systems (RF MEMS)," *Sandia Report No. SAND213-10670P*, 96 pages, published in *Wiley Encyclopedia of Electrical and Electronics Engineering*, 2014, pp. 1-31.
Okamoto H et al., "The Au—Si (gold—silicon) system," *Bull. Alloy Phase Diagrams* Sep. 1983;4(2):190-8.
Olsson RH et al., "A high electromechanical coupling coefficient SH0 Lamb wave lithium niobate micromechanical resonator and a method for fabrication," *Sens. Actuat. A* 2014;209:183-90.
Olsson RH et al., "Multi-frequency aluminum nitride micro-filters for advanced RF communications," *Government Microcircuit Application and Critical Technology Conference*, held on Mar. 22-25, 2010 in Reno, NV, pp. 257-260 (4 pp.).
Olsson RH et al., "Post-CMOS-compatible aluminum nitride resonant MEMS accelerometers," *J. Microelectromech. Sys.* 2009;18(3):671-8.
Olsson RH et al., "Post-CMOS compatible aluminum nitride MEMS filters and resonant sensors," *IEEE Frequency Control Symposium*, held on May 29-Jun. 1, 2007 in Geneva, Switzerland, pp. 412-419.
Olsson RH et al., "VHF and UHF mechanically coupled aluminum nitride MEMS filters," *IEEE Int'l Frequency Control Symposium*, held on May 19-21, 2008 in Honolulu, HI, pp. 634-639.
Piazza G, "Piezoelectric aluminum nitride vibrating RF MEMS for radio front-end technology," *Ph.D. Dissertation for University of California, Berkeley*, 2001 (abstract only, 4 pp.).
Piazza G et al., "Single-chip multiple-frequency AlN MEMS filters based on contour-mode piezoelectric resonators," *J. Microelectromech. Sys.* 2007;16, 2007, pp. 319-328.
Piazza G et al., "Piezoelectric aluminum nitride vibrating contour-mode MEMS resonators," *J. Microelectromech. Sys.* 2006;15(6):1406-18.
Schwindt PDD et al., "Micro ion frequency standard," *Proc. 41st Annual Precise Time and Time Interval Systems and Applications Meeting*, held on Nov. 16-19, 2009 at Santa Ana Pueblo, NM, pp. 509-518.
Teshigahara A et al., "Scandium aluminum nitride: Highly piezoelectric thin film for RF SAW devices in multi GHz range," *IEEE Int'l Ultrasonics Symposium*, hled on Oct. 7-10, 2012 in Dresden, Germany, pp. 1-5.
Vittoz EA et al., "High-performance crystal oscillator circuits: theory and applications," *IEEE J. Solid-State Circuits* 1988;23(3):774-83.
Wojciechowski KE et al., "Parallel lattice filters utilizing aluminum nitride contour mode resonators," *Solid-State Sensors, Actuators, and Microsystems Workshop*, held on Jun. 2-6, 2010 in Hilton Head, SC, pp. 65-69.
Wojciechowski KE et al., "Single-chip precision oscillators based on multi-frequency, high-G aluminum nitride MEMS resonators," *Int'l Conference on Solid State Sensors and Actuators and Microsystems (Transducers '09)*, held on Jun. 21-25, 2009 in Denver, CO, pp. 2126-2130.
Wojciechowski KE et al., "Super high frequency width extensional aluminum nitride (AlN) MEMS resonators," *IEEE Int'l Ultrasonic Symposium Proceedings*, held on Sep. 20-23, 2009 in Rome, Italy, pp. 1179-1182.
Zhao Y et al., "Pulsed photothermal reflectance measurement of the thermal conductivity of sputtered aluminum nitride thin films," *J. Appl. Phys.* 2004;96:4563-8.

* cited by examiner

US 9,203,134 B1

TUNING METHOD FOR MICRORESONATORS AND MICRORESONATORS MADE THEREBY

STATEMENT OF GOVERNMENT INTEREST

This invention was developed under Contract DE-AC04-94AL85000 between Sandia Corporation and the U.S. Department of Energy. The U.S. Government has certain rights in this invention.

FIELD OF THE INVENTION

The invention relates to the field of microelectromechanical systems (MEMS) and more particularly to microscale mechanical resonators.

ART BACKGROUND

The term "microresonator" as used herein refers to a mechanical or electromechanical resonator including a resonant element fabricated on a microscale, i.e. on a scale of micrometers to millimeters. Microresonators have important applications in various fields, including signal processing and sensing. For example, microresonators fabricated from aluminum nitride (AlN) are used in radiofrequency (RF) filters, accelerometers, and sensors. AlN is one example of a piezoelectric material that responds both electrically and mechanically to applied electric signals, and that can be formed into an electroacoustic resonator capable of modifying such signals.

Microscale fabrication techniques are sufficiently developed to afford control over geometrical properties of the resonant element such as its vertical thickness, lateral dimensions, and shape. This is true for AlN resonators as well as for resonators of other compositions, such as silicon. Through the control of such properties, it is possible to engineer the resonant behavior of the element via its elastic and dielectric characteristics.

Thus, for example, an AlN microresonator RF filter having the known structure shown in a schematic perspective view in FIG. 1 is readily designed to have a passband centered at any frequency in the range 30 kHz to 10 GHz and a Q factor as high as 1500 or even more. One typical center frequency useful for RF communications is 22 MHz.

In the figure, element 10 is an AlN resonant element formed on silicon substrate 20. Wing portions 30, 35 of the resonant element are acoustically isolated from the substrate by etching a trench around them which undercuts the resonant element to form void 40 as best seen in cutaway view 50. Metallization pattern 60 conducts input and output signals between external conductors 70 and upper and lower electrode layers (not shown), which are typically formed adjacent the respective upper and lower faces of element 10. The bottom electrode is typically electrically isolated from the silicon substrate by a silicon oxide layer.

Devices such as the RF filter of FIG. 1 are generally fabricated using well-known wafer-scale integrated circuit (IC) microfabrication techniques such as CMOS techniques. Although the design specifications are generally directed to particular desired resonant frequencies, small process variations are likely to produce variations in the resonant frequency from lot to lot and even across a single substrate wafer. Those individual devices that best match the desired frequency can of course be selected from a large lot, but such a practice generally leads to low yields and high unit costs. Hence, there remains a need for methods of finely tuning the fabricated devices so that yields of devices that conform to specifications can be improved, and so that particular tuning requirements can be met with high reliability.

SUMMARY OF THE INVENTION

We have found such a method.

In a broad aspect, our method involves applying a film or films of metal to an acoustically or electroacoustically resonant element to adjust the resonant frequency of the element. Further control over the resonant frequency is afforded by annealing the metal films.

Our method is broadly applicable to resonant micromechanical structures of various kinds. In a more specialized aspect, our method applies to piezoelectric resonant elements. In a still more specialized aspect, our method applies to piezoelectric AlN microresonators.

Accordingly, an embodiment of our invention relates to a method for fabricating a resonant device, comprising depositing one or more metallic layers on at least one surface of a resonant micromechanical element, and annealing the metallic layers. (The term "metallic" is meant to include metals, metal alloys, and highly conductive ceramics such as titanium nitride.) In embodiments, a layer of titanium nitride (TiN) is deposited and annealed. In embodiments, layers of titanium nitride (TiN), aluminum-copper (Al—Cu), and titanium (Ti) are deposited and annealed.

Another embodiment of our invention relates to apparatus comprising a resonant micromechanical element and a film of titanium nitride deposited on a facial surface of the element.

DETAILED DESCRIPTION

We have found that the resonant frequency of an AlN microresonator can be tuned by controlling the stress in a film, comprising one or more layers of TiN and/or aluminum-copper alloy (Al—Cu) that is deposited so as to overlie the upper face of the AlN resonant element. We believe that this technique will not be limited to AlN microresonators, but instead will be broadly applicable to any of various types of microresonators, including those made from piezoelectric materials, silicon, or other materials. We note in this regard that our illustrative AlN microresonator, which will be described in more detail below, is designed to support the propagation of Lamb waves, i.e., of longitudinal oscillations of thin plates. Because this is the physical regime in which the overlying film will have the strongest tuning effect, we believe that our discovery will be especially useful for tuning resonators of thickness that is no more than one-half the resonant acoustic wavelength.

We also note that the range of film compositions useful for applying our new tuning technique is not limited to TiN and Al—Cu, but instead extends to any annealable material that has appropriate material and processing compatibilities, and has an elastic modulus, a density, and a thermal coefficient for the change in the elastic modulus (CTE) that jointly affect the tuning enough to have practical effect. By "annealable material" we mean a material whose elastic modulus may be altered by annealing, and which retains at least part of the change when returned to room temperature. However, TiN is of particular interest not only because it has an advantageous combination of elastic modulus, density, and CTE, but also because the state of stress of TiN films is known to undergo a transition from compressive to tensile at a temperature of about 400 C.

Figure 1:
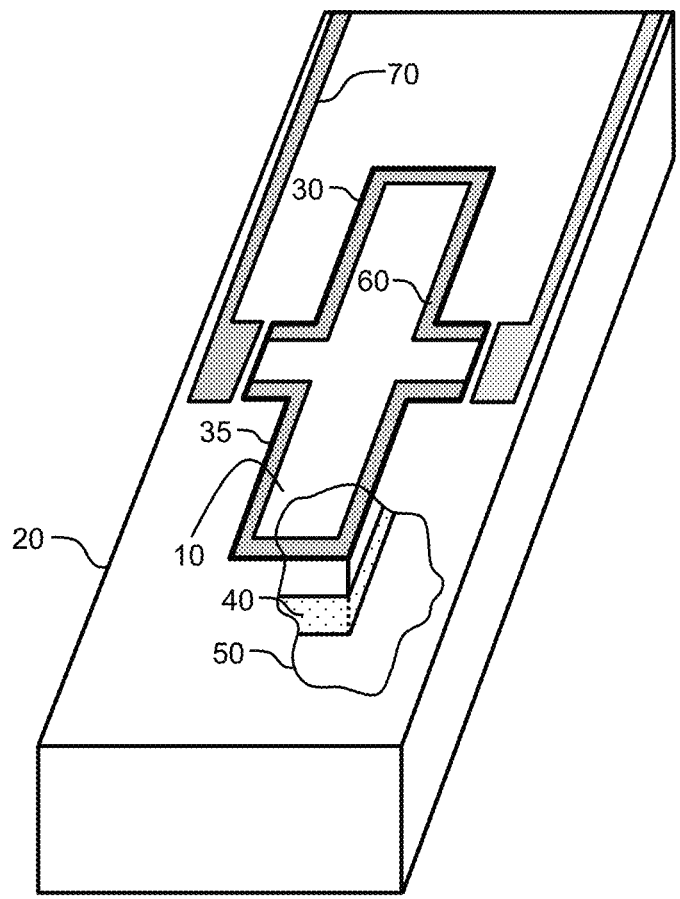
FIG. 1 is a plan view of a known AlN microresonator RF filter.
Figure 2:
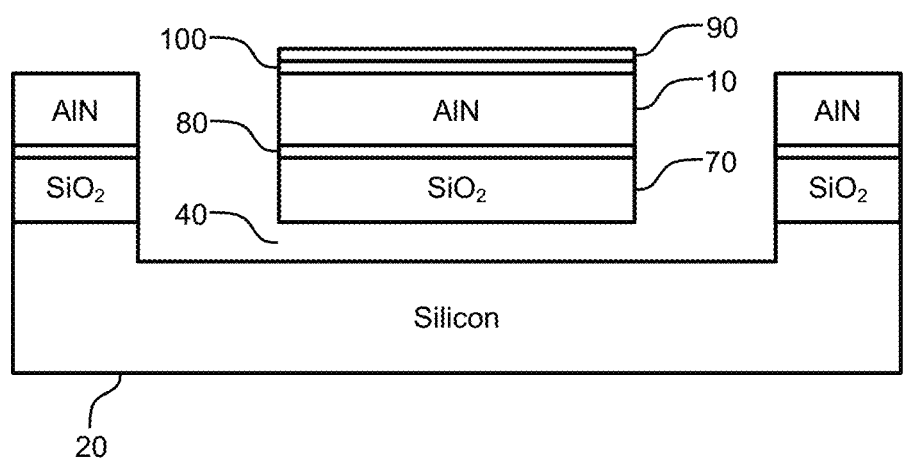
FIG. 2 is a cross-sectional view of an AlN microresonator according to the new method described here.

FIG. 2 shows, in schematic cross sectional view, an illustrative embodiment of an AlN microresonator similar to that of FIG. 1, with a tuning layer added in accordance with the principles described here. Some details have been omitted from the figure for clarity. Elements common to FIGS. 1 and 2 have been designated by like reference numerals. It will be seen that the arrangement illustrated in FIG. 2 includes silicon dioxide layer 70, lower electrode layer 80, and upper electrode layer 90. Also shown in the figure is tuning layer 100 deposited over resonant element 10.

Wafer-scale fabrication of devices such as those of FIG. 2 can be performed using standard CMOS compatible fabrication techniques, which are well known and need not be described here in detail. In one illustrative wafer-scale procedure for making a plurality of resonators having a nominal center frequency of, e.g., 22 MHz, a silicon dioxide layer and low temperature silicon (Si) release layer are deposited on a silicon wafer of resistivity greater than 5000 Ohm-cm.

The Si release layer is patterned and etched, followed by deposition and planarization of a temperature compensating silicon dioxide layer of thickness 760 nm. This silicon dioxide layer, which forms the bottom of the suspended resonator, provides passive resonator temperature compensation by virtue of its positive thermal coefficient of expansion, which can at least partially offset the negative thermal coefficient of expansion of the AlN piezoelectric material. The silicon dioxide layer is exemplarily formed by a conventional wet oxidation process. Alternatively, it may be deposited by a chemical vapor deposition (CVD) process such as low-pressure CVD or plasma-enhanced CVD.

A bottom resonator electrode metal stack, corresponding to layer 80 of FIG. 2, consists in this illustrative embodiment of Ti (20 nm), TiN (50 nm), and Al—Cu (100 nm). It is deposited on the silicon dioxide layer and patterned by, e.g. plasma etching. This bottom metal stack serves as both a tuning layer and as a conductive contacting layer. The piezoelectric layer of AlN (750 nm) is then sputter deposited on the Al—Cu. This is followed by deposition of the top tuning layer over the piezoelectric layer. For forming the top tuning layer, first Al—Cu (200 nm) is deposited, and then TiN (50 nm). The top tuning layer is then patterned.

More generally, we note that the top tuning layer can be patterned either before or after the patterning of the piezoelectric layer. Moreover, the top tuning layer may also be involved in the creation of electrical contacts. Accordingly, at least some process sequences will include etching holes in the piezoelectric layer, followed by the deposition and patterning of the metal or metals for the top tuning layer.

The AlN piezoelectric layer is patterned and etched by, e.g., RIE to define the dimensions of the resonator, which in an illustrative embodiment is 180.6 µm wide and 50 µm long, and to open a set of release holes down to the Si release layer. A top metal layer of Au (500 nm) is then deposited on the upper electrode. Last, the resonators are released and suspended by performing an isotropic xenon difluoride ($XeF_2$) dry etch of the silicon release layer. Possible alternatives to $XeF_2$ are silicon hexafluoride ($SF_6$) or nitrogen trifluoride ($NF_3$) which, like $XeF_2$ are selective dry etchants that isotropically etch silicon.

The nominal resonator center frequency can be predicted from:

$$f_o = \frac{1}{2W}\sqrt{\frac{\Sigma E * t}{\Sigma \rho * t}}$$

wherein W is the resonator width, E is the respective Young's modulus of each of the layers over which the summations are taken, t is the respective thickness of each layer, and ρ is the respective density of each layer. The summations are taken over all layers of the resonant element. It will thus be understood that the sums are respectively a weighted average of the elastic modulus and a weighted average of the density, in which the weight factors are the thicknesses of the respective layers.

It will be understood that because of their thicknesses, the AlN and silicon dioxide layers will dominate the resonator acoustic velocity in the illustrative embodiment described above. However, even relatively thin tuning layers added to the resonator can have a significant effect on the resonant properties.

In particular, we found that we could shift the resonator center frequencies by annealing those resonators that included tuning layers. For example, we annealed a 22-MHz resonator having a sputter-deposited 50-nm TiN tuning layer, and found that a 400 C anneal for 25 minutes increased the resonant frequency by 60 kHz. We observed that an anneal time of 5 minutes was sufficient to reach the new frequency, which was not affected by further annealing at the same temperature, and which appeared to be permanent upon cooling.

Although such an understanding is not essential for the application of the principles described here, we attribute the thermal tuning effect to changes in the state of stress of the deposited layers induced by heat treatment. By permanently changing the stress state of the tuning layer, we believe that we likewise shift the effective elastic modulus of the resonator.

The shift in the elastic modulus $E_i$ of the i'th layer is usefully modeled according to the linear extrapolation formula:

$$E_i = E_{oi} + c_i * (T - 25)$$

wherein $E_{0i}$ is the value of the elastic modulus at room temperature (25 C) prior to annealing, $c_i$ is a temperature coefficient of the elastic modulus, and T is the annealing temperature in Celsius degrees. In our experiments, annealing was performed by Rapid Thermal Anneal (RTA).

For the purpose of modeling an arrangement similar to the illustrative embodiment described above, the AlN and $SiO_2$ layers can be neglected because they are not expected to substantially change their states of stress in the 400 C-500 C temperature range that is of primary interest. (The melting point of aluminum is 660 C, which in many cases will impose a practical upper limit on the anneal temperature.) Likewise, the titanium (Ti) adhesion layer can be neglected because it is only 20 nm thick. Thus, to a good approximation, only the Al—Cu and TiN tuning layers need be considered.

By inserting the second of the above equations in to the first and summing over the Al—Cu and TiN layers, the predicted dependence of resonant frequency on anneal temperature is obtained. We emphasize that this temperature dependence relates to a permanent change in the stress state, and is thus distinct from the type of active temperature compensation seen, for example, when using an oxide layer to counter the negative thermal expansion of AlN.

Values of the parameters needed to calculate the resonant frequency of a microresonator in our illustrative embodiment are provided in Table 1, below. Based on those values, our model predicts a center frequency of 22.4 MHz. In an experiment, we measured the frequencies of 59 resonators arranged across a die wafer. The mean measured frequency was 22.35 MHz, the mean quality factor was approximately 2400, and the mean kt2 was 0.0084. For an anneal temperature of 400 C, our model predicted a frequency upshift of 4271 ppm due to a change in the moduli of the Al—Cu, TiN, and Ti films. The model equation for those three films took the form:

$$f_o = \frac{1}{2W} \sqrt{\frac{E_{AlN}*t_{AlN} + E_{SiO2}*t_{SiO2} + (E_{TiN} + C_{TiN}(T-25))*t_{TiN} + (E_{AlCu} + C_{AlCu}(T-25))*t_{AlCu}}{\rho_{AlN}*t_{AlN} + \rho_{SiO2}*t_{SiO2} + \rho_{TiN}*t_{TiN} + \rho_{AlCu}*t_{AlCu}}}$$

TABLE 1

| | Al—Cu | TiN | Ti | SiO2 | AlN |
|---|---|---|---|---|---|
| Elastic Modulus (GPA) - Ei | 51 | 350 | 125 | 73 | 342 |
| Density (kg/m3) - ρi | 2700 | 5220 | 4056 | 2200 | 3230 |
| CTE (ppm/C) - Ci | 23.98 | 7.2 | 9.97 | — | — |

Figure 3:
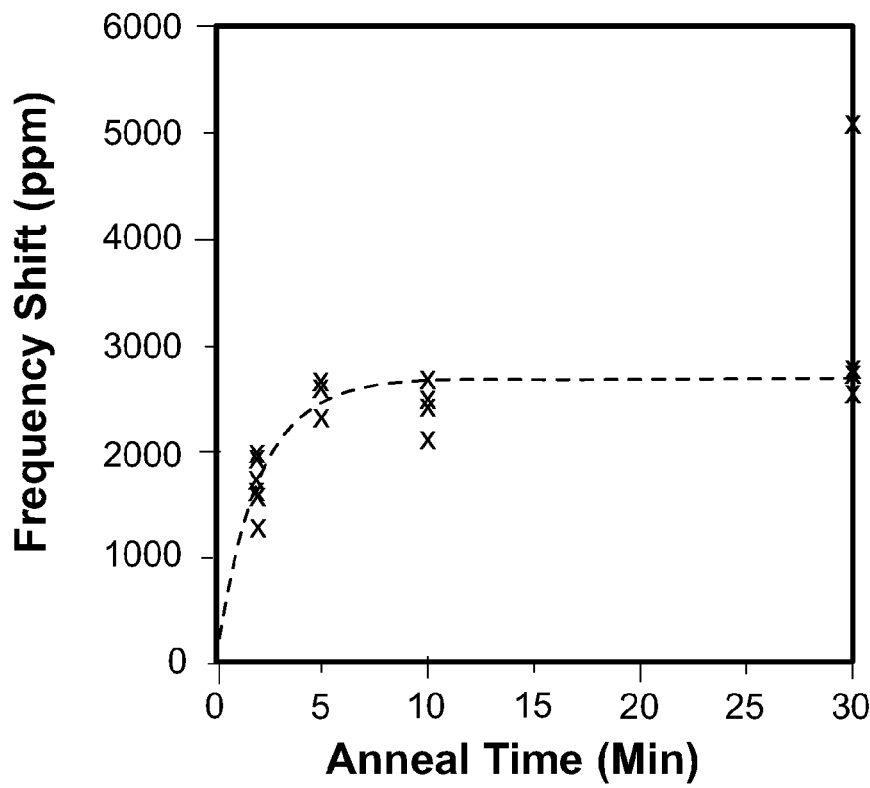
FIG. 3 is a graph of frequency shift versus anneal time for a group of resonators of the kind described above.

FIG. 3 provides the results of an experiment we performed to determine how the frequency shift depends on anneal time in resonators of the kind described above. Designated groups of resonators were purged with argon and then annealed under vacuum by RTA at 400 C for respective times of 2, 5, 10 and 30 minutes. The center frequencies were measured before and after anneal. All resonator frequencies were observed to shift upward, but saturation was observed at a time of about 5 minutes. The total relative frequency shift was about 2700 ppm.

Figure 4:
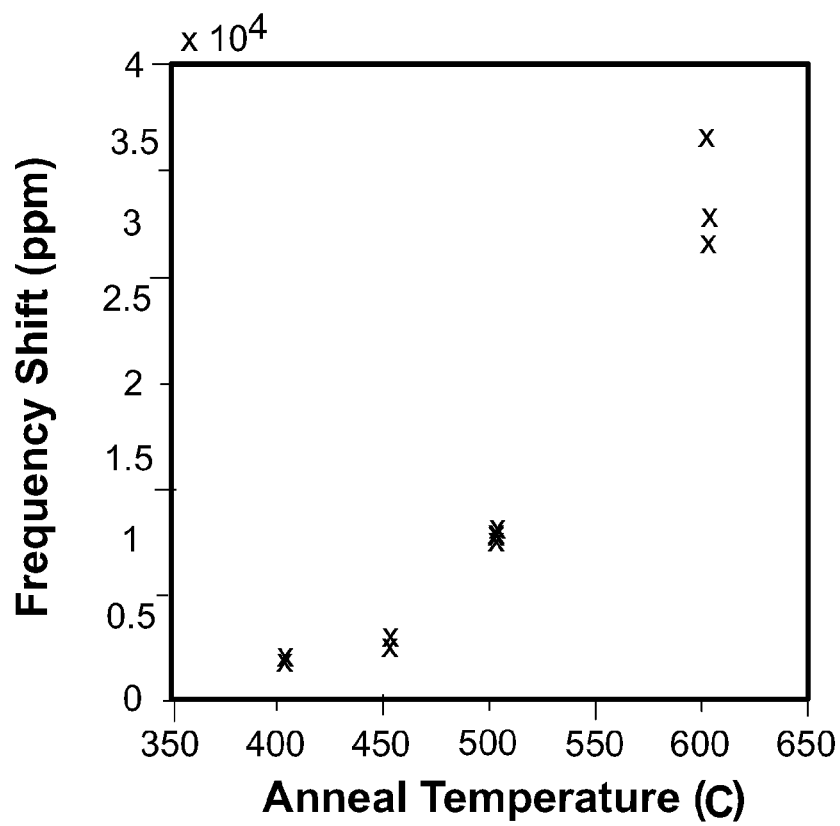
FIG. 4 is a graph of frequency shift versus anneal temperature for a group of resonators of the kind described above.

FIG. 4 provides the results of an experiment we performed to determine how the frequency shift depends on anneal temperature. Again, four designated groups of resonators were annealed for five minutes at respective temperatures of 400 C, 450 C, 500 C, and 600 C under the same vacuum conditions reported above. The resulting frequency shift had a greater than linear dependence on temperature, with a maximum shift of 30,000 ppm. Only the samples annealed at 600 C visually displayed adverse effects due to annealing. The damage was observed only on the aluminum layer, and the electrical performance of the resonators was not observed to deteriorate significantly. The 500 C anneals indicated no damage to the Al metal layer. We concluded that in resonators of the kind tested, annealing by RTA at 500 C for 5 minutes can produce a permanent 1.2%, or 12000 ppm, upshift in resonator frequency.

Figure 5:
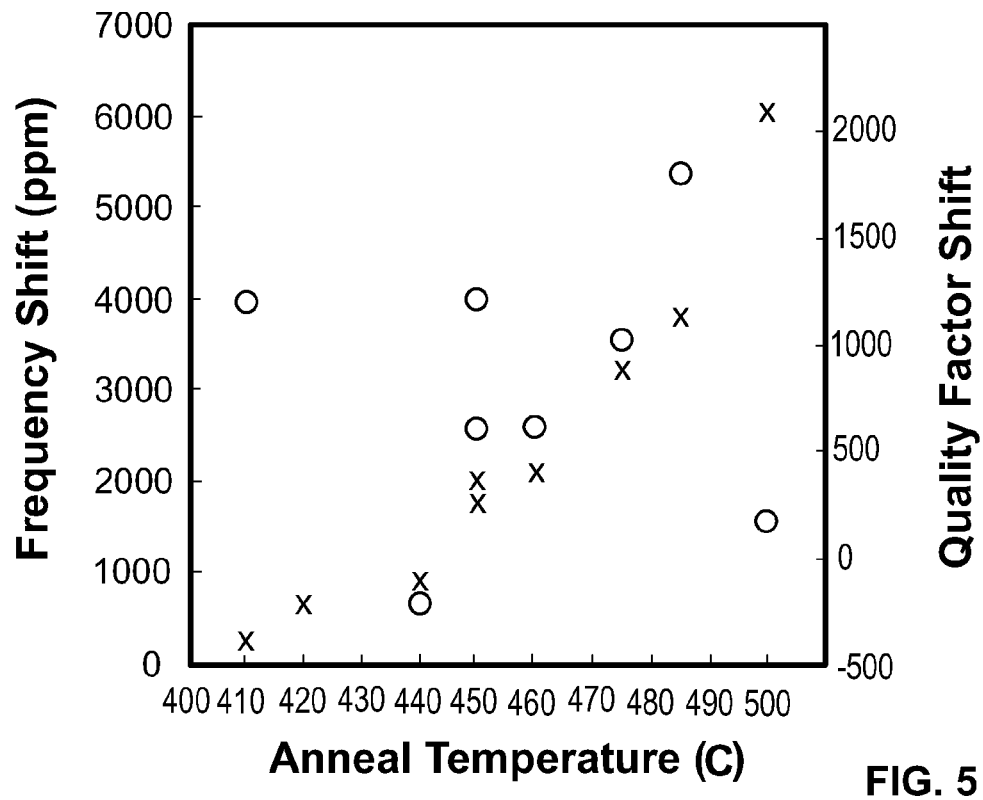
FIG. 5 is a graph of frequency shift ("x" marks in the figure) and of shifts in the resonator quality factor ("o" marks in the figure) versus anneal temperature for a group of resonators fabricated at wafer level as described above and then encapsulated in a wafer-level packaging (WLP) process.

FIG. 5 provides the results of a further experiment to determine the effect of annealing on the frequency shift ("x" marks in the figure) and on shifts in the resonator quality factor ("o" marks in the figure). Resonators were fabricated at wafer level as described above, and then encapsulated in a wafer-level packaging (WLP) process. In the WLP process, the wafer was subjected to a 25-minute anneal at 400 C, which we believe to have upshifted the center frequencies of the nominally 22-MHz resonators by about 50-60 kHz.

The wafer was singulated using a dicing saw, and individual dies were electrically tested for RF performance. Ten dies were selected, beginning at the wafer flat and continuing across through the center of the wafer. Variations in resonator frequency were in the approximate range of 22.3 MHz to 22.6 MHz, thus exhibiting a 1.3% variation across the wafer. Resonator quality factors ranged around 1500 to 2500.

Selected dies were then annealed by RTA for five minutes in an argon-purged vacuum environment at various anneal temperatures, and then measured again for resonant frequency and quality factor. FIG. 5 shows the shifts produced by the five-minute anneal, relative to the condition of the resonators after the WLP processing. It will be seen from the figure that the maximum observed frequency shift was about 6000 ppm. The quality factor was seen to improve with increased temperature up to about 485 C.

Figure 6:
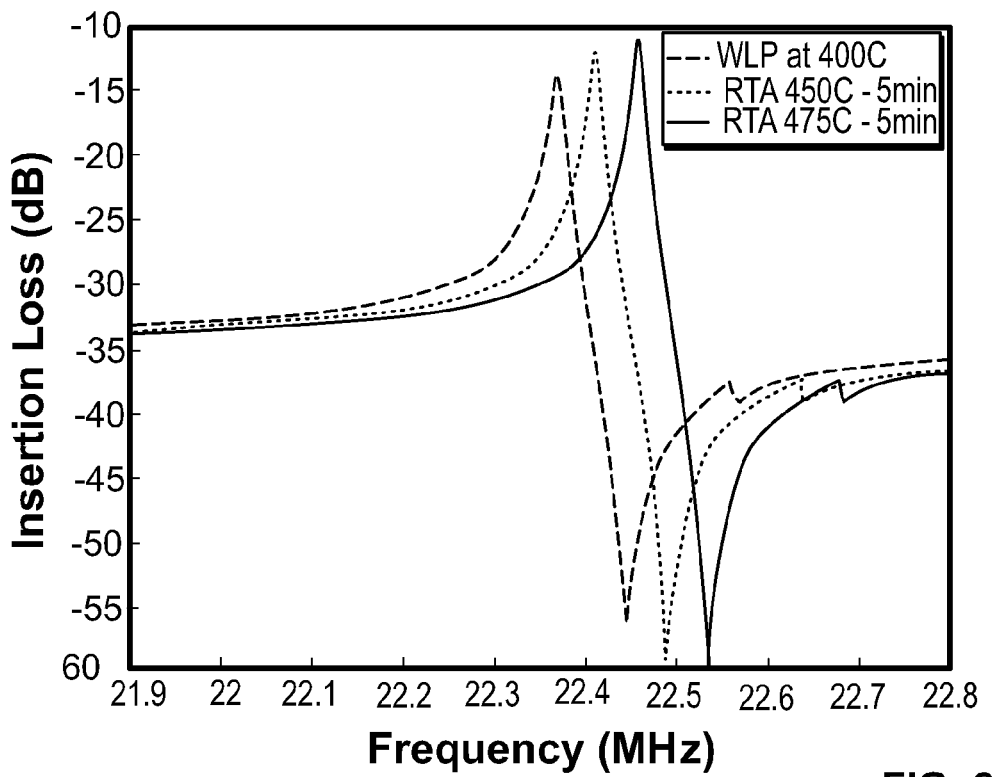
FIG. 6 is a plot of insertion loss versus frequency for a sample resonator at three different stages in the wafer processing. In order from left to right, the stages are: Wafer-level packaging (WLP) heat treatment only; WLP followed by anneal at 450 C; and WLP followed by anneal at 450 C and 475 C.

FIG. 6 shows the results of a further experiment to characterize the effect of annealing on resonant behavior. A sample resonator, packaged by WLP, was annealed at 450 C for 5 minutes and then again at 475 C for 5 minutes. The figure displays a plot of insertion loss versus frequency for three stages in the processing of the sample wafer; in order from left to right they are: WLP heat treatment only, WLP followed by anneal at 450 C; and WLP followed by anneal at 450 C and 475 C. It will be seen upon examination of the figure that annealing the resonator shifted the resonant frequency and also reduced insertion loss and improved the quality factor. The displayed results also suggest that successive anneals at increasing temperatures can be used to successively upshift the resonant frequency.

Small process variations can produce significant variations over the wafer area in the precise resonant frequencies of individual resonators. These variations are generally not entirely random, but instead exhibit spatial correlations. As a consequence, it may be advantageous, in at least some cases, to singulate the wafer into dies and bin the dies into groups requiring the same amount of frequency shift (and hence the same anneal temperature).

Figure 7:
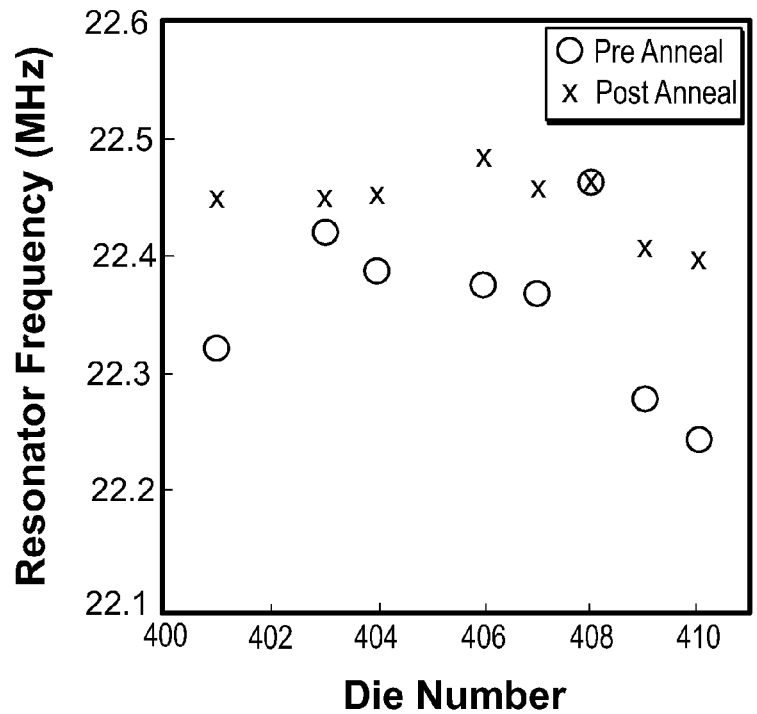
FIG. 7 shows the results of an experiment to determine whether annealing can be used to equalize the center frequencies of resonators formed as a row of dies on a wafer. In the figure, resonator frequency is plotted versus die number for the resonators as evaluated before the corrective annealing step ("o" marks in the figure) and after the corrective anneal ("x" marks in the figure).

FIG. 7 shows the results of an experiment to determine whether annealing can be used to equalize the center frequencies of resonators formed as a row of dies on a wafer. In the figure, resonator frequency is plotted versus die number for the resonators as evaluated before the corrective annealing step ("o" marks in the figure) and after the corrective anneal ("x" marks in the figure).

To obtain the data displayed in FIG. 7, a row of dies was selected from a WLP-processed wafer. Packaged resonators were evaluated across the row, beginning at the wafer flat and continuing across to the wafer top. The equation $$\Delta F = 13.16 * (T-400)^2$$

which we determined by empirical curve-fitting, was then used to determine the appropriate RTA temperature needed to bring each respective die to a common adjusted resonator frequency (see Table 2, below). In the equation, $\Delta F$ represents the frequency shift produced by annealing at temperature T. We were able to achieve the targeted frequency, on average, to an accuracy of about 17 kHz (700 ppm), and we were able to reduce the frequency distribution from 21,700 ppm to 3900 ppm.

The experimental processing conditions and results are summarized in Table 2:

TABLE 2

| Die | Starting Frequency (MHz) | Anneal Temp (C.) | Annealed Frequency (MHz) | Predicted Frequency (MHz) | Predicted-Annealed (MHz) |
|---|---|---|---|---|---|
| 0401 | 22.32 | 500 | 22.446875 | 22.4516 | 0.0047 |
| 0403 | 22.41875 | 450 | 22.449375 | 22.448525 | −0.00085 |
| 0404 | 22.386875 | 460 | 22.45 | 22.434251 | −0.015 |
| 0406 | 22.375625 | 475 | 22.4825 | 22.501525 | 0.019025 |
| 0407 | 22.368125 | 475 | 22.456875 | 22.484025 | −0.02715 |
| 0408 | 22.463125 | x | x | x | x |
| 0409 | 22.2775 | 500 | 22.4050 | 22.408475 | 0.003475 |
| 0410 | 22.24375 | 500 | 22.5225 | 22.466600 | −0.0559 |

Figure 8:
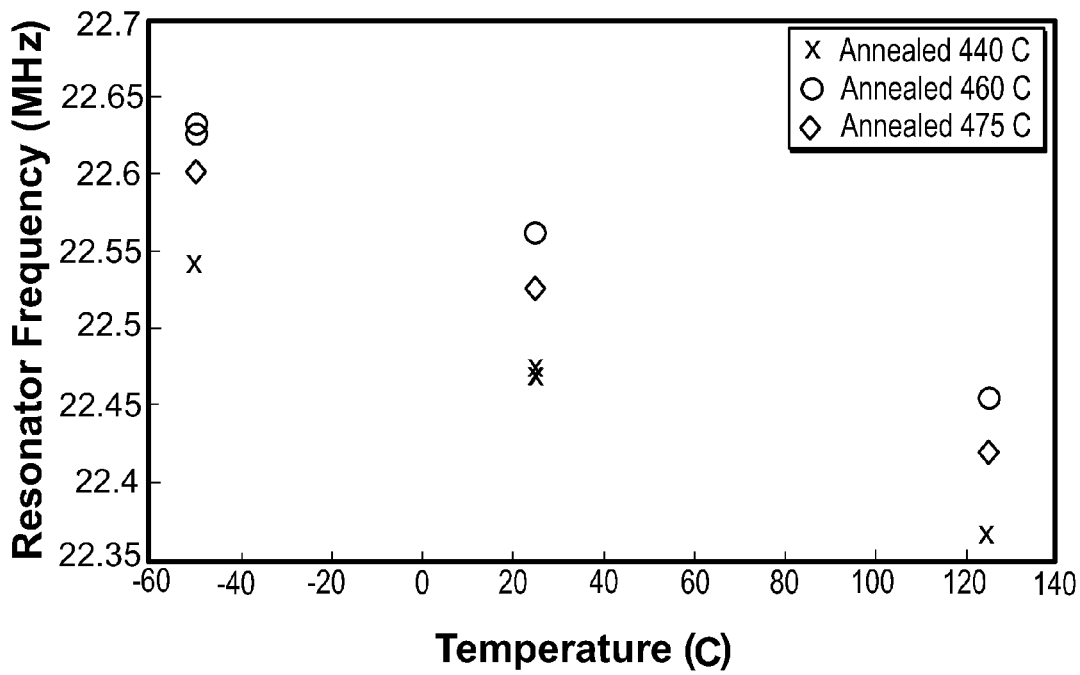
FIG. 8 shows the results of a temperature-cycling experiment to verify that the frequency shifts induced by annealing were permanent. In the figure, we have plotted the resonant frequencies of three resonators at various points in the temperature cycle. The three resonators, which were annealed at different temperatures, are respectively indicated in the figure by "x" marks, "o" marks, and "0" marks.

To verify that the frequency shifts induced by annealing were permanent, we performed a temperature-cycling experiment, the results of which are displayed in FIG. 8. Three dies, annealed at 440 C, 460 C, and 475 C respectively, were temperature cycled between a minimum temperature of −50 C, room temperature (25 C), and a maximum temperature of 125 C while their frequency response was measured. Two temperature cycles, starting at 25 C and raised to 125 C, were first performed in order to verify post-anneal thermal stability. Thereafter, the devices were subjected to two full temperature cycles (starting at 25 C) down to −50 C and then back up to 125 C.

In the figure, we have plotted the resonant frequencies of three resonators, respectively indicated by the "x" marks, the "o" marks, and the "0" marks, at various points in the temperature cycle. The resonator indicated by "x" was annealed at 440 C, the resonator indicated by "o" was annealed at 460 C, and the resonator indicated by "0" was annealed at 475 C.

Since the resonators were not fully temperature compensated with the oxide, shifting of the resonator frequency was observed while at the elevated or reduced temperatures. However, no significant hysteresis was observed. This indicated that the resonators could be tuned using the RTA, but the effect is permanent during subsequent operation under standard operating temperatures.

In the illustrative example provided above, the tuning layer consisted of Al—Cu (200 nm) and then TiN (50 nm). Although these dimensions will be typical, a very broad range of thicknesses may be useful depending on specific effects desired. Thus, the total thicknesses of tuning layers may range from a few nanometers to several hundred nanometers, and even to a micrometer or more. One practical limit on the amount of material that may be added in a tuning layer may be imposed by the effect of the total mass on the resonant frequency. Another practical limit may be imposed by the effect of the added thickness on the nature of wave propagation. That is, the tuning layer will be most effective in affecting thin-plate, or Lamb wave, oscillations, for which the total thickness of the vibrating plate is characteristically less than one-half the resonant wavelength. Hence, if the total thickness grows to substantially more than one half wavelength due to the added tuning layer, the thermal tuning effect may be reduced.

Those skilled in the art will appreciate that micromechanical resonators as described above have numerous practical applications, all of which should be understood as included within the scope and spirit of the present invention. One particular practical application is in the field of radiofrequency (RF) filters. Designs for RF filters using piezoelectric micromechanical resonators are known. One advantage of the new ideas presented here is that a new method is provided for tuning such filters. That is, filter characteristics such as the center frequency of a band that is passed or rejected, or the position of a frequency cutoff, or a parameter affecting the shape of a filter response curve, may be adjusted by annealing one or more resonators that are elements of the filter. There is especially great flexibility in the thermal tuning of filters that include multiple micromechanical resonators, because different resonators within the same filter will respond differently to the same heat treatment if they include tuning layers of different designs and/or compositions.

What is claimed is:

1. A wafer comprising a plurality of dies, each die comprising a resonant micromechanical element and an annealed film deposited on a facial surface of the resonant element,
   wherein each resonant element comprises a common resonator frequency,
   wherein the common resonator frequency is configured by annealing a film of annealable material at an annealing temperature required to permanently change a stress state of the film, as compared to the film without annealing, thereby providing the annealed film and the common resonator frequency, and
   wherein the annealable material comprises a material whose elastic modulus is altered by annealing and which retains at least part of the change in elastic modulus when returned to room temperature.

2. The wafer of claim 1, wherein the annealed film comprises one or more layers, and each said layer comprises a metal, a metal alloy, or a metallic ceramic.

3. The wafer of claim 1, wherein the annealed film comprises titanium nitride and/or an aluminum-copper alloy.

4. The wafer of claim 1, wherein the resonant element is configured to resonate at one or more frequencies associated with Lamb wave propagation in said element.

5. The wafer of claim 1, wherein the annealed film comprises two or more layers having different compositions, each said layer comprising an annealable material.

6. The wafer of claim 1, wherein the annealing temperatures for at least two dies are different.

7. The wafer of claim 1, wherein the annealed film is electrically conductive and is in electrical contact with the resonant element and with a conductive path for signal input and output.

8. The wafer of claim 1, wherein the resonant element is supported on a substrate, the facial surface is a surface distal to the substrate, and the wafer further comprises an electrical conductor pattern arranged to deliver a radiofrequency input signal to the element and deliver a radiofrequency output signal from the element.

9. The wafer of claim 1, wherein the resonant element is piezoelectric.

10. The wafer of claim 1, wherein the resonant element comprises aluminum nitride.

11. The wafer of claim 1, wherein the common resonator frequency of each of the resonant elements is configured by increasing an initial resonant frequency up to about 1.2%.

12. The wafer of claim 1, wherein the common resonant frequency of each of the resonant elements is about 22 MHz.

13. The wafer of claim 1, wherein the resonant element is a piezoelectric aluminum nitride microresonator.

14. The wafer of claim 13, wherein the resonant element has a peak radiofrequency transmission frequency.

15. The wafer of claim 1, wherein the resonant element is conformed as a radiofrequency filter.

16. The wafer of claim 1, wherein the annealable material comprises a thermal coefficient for the change in the elastic modulus that is of from about 7 ppm/C to about 24 ppm/C.

17. The wafer of claim 1, wherein the annealable film has thickness greater than 20 nm.

18. A method for fabricating at least one resonant device, the method comprising:
   depositing a film of annealable material on at least one surface of a resonant micromechanical element, wherein the annealable material comprises a material whose elastic modulus is altered by annealing and which retains at least part of the change in elastic modulus when returned to room temperature,
   identifying a desired common resonator frequency for the resonant element, and
   upshifting a resonator frequency of the resonant element to the desired common resonator frequency by annealing the film of annealable material at an annealing temperature corresponding with the desired common resonator frequency.

19. The method of claim 18, wherein the annealable material is deposited in one or more layers, and each said layer comprises a metal, a metal alloy, or a metallic ceramic.

20. The method of claim 18, wherein the annealable material comprises titanium nitride and/or an aluminum-copper alloy.

21. The method of claim 18, wherein the depositing step comprises depositing two or more layers of annealable material having different compositions, and wherein the upshifting step comprises annealing at a sufficient time and temperature to modify the elastic modulus of at least one of said layers.

22. The method of claim 18, wherein the resonant element is one of a plurality of similar elements formed concurrently on a substrate wafer such that each has a respective facial surface, and a respective film of annealable material is deposited concurrently on each of said facial surfaces.

23. The method of claim 22, wherein the annealing is applied to the entire substrate wafer.

24. The method of claim 22, further comprising dicing the substrate wafer into parts such that each part is populated by one or more resonant elements having similar resonant frequencies, and independently annealing each of said parts.

25. The method of claim 22, further comprising dicing the substrate wafer into parts, each populated by one said resonant element, and independently annealing at least one said part.

26. The method of claim 25, further comprising measuring a resonant frequency of at least one said resonant element and determining the annealing temperature based on the measured frequency, and wherein the annealing is carried out at the annealing temperature that has been determined.

27. The method of claim 18, wherein:
   the depositing step comprises depositing a combination of two or more layers of annealable material having different compositions;
   the method further comprises providing a correspondence between anneal temperatures and resonant frequency shifts for the deposited combination; and
   the annealing step comprises annealing at a temperature selected according to said correspondence.

28. The method of claim 18, wherein the annealing is carried out at a temperature of at least 400 C.

29. The method of claim 18, wherein the annealing is performed according to a time and temperature profile selected to bring about a desired change in a resonant frequency of the resonant element.

30. The method of claim 18, wherein the film comprises titanium nitride that is deposited in a compressive state of stress, and the annealing is carried out so as to cause the film to transition to a tensile state of stress.

31. The method of claim 18, wherein the resonant element is a piezoelectric microresonator.

32. The method of claim 31, wherein the resonant element is one of a plurality of similar elements formed concurrently on a substrate such that each has a respective facial surface, a respective titanium nitride film is deposited concurrently on each of said facial surfaces, and the annealing is applied to the entire wafer.

33. The method of claim 25, further comprising binning each part into groups requiring the same amount of frequency shifting and then performing the annealing step separately for each group.

34. A method for tuning a device that comprises a resonant micromechanical element, the method comprising:
   measuring a resonant frequency of the resonant element,
   identifying a desired common resonator frequency for the resonant element,
   determining an annealing temperature that is selected to produce a desired shift in a resonant frequency of the resonant element, wherein the desired shift is a frequency difference between the measured resonant frequency and the desired common resonator frequency, and
   annealing a film of annealable material deposited on at least one surface of said resonant element at the annealing temperature, wherein the annealable material comprises a material whose elastic modulus is altered by annealing and which retains at least part of the change in elastic modulus when returned to room temperature.

35. The method of claim 34, wherein the annealing is carried out at successive anneals at increasing temperatures in order to successively upshift a resonant frequency of said resonant element.

36. The method of claim 34, wherein the device comprises a radiofrequency filter, the filter comprises at least one said resonant element, and the annealing is carried out at a temperature selected to produce a desired change in a filter characteristic.

37. The method of claim 34, wherein the device comprises a wafer-level packaged device, a wafer-level packaged filter, or a wafer-level packaged resonator.

\* \* \* \* \*